United States Patent [19]
Klingenfus

[11] Patent Number: 5,598,176
[45] Date of Patent: *Jan. 28, 1997

[54] TIME PERIOD ADJUSTABLE BAR GRAPH DISPLAY

[76] Inventor: Eric Klingenfus, 7505 Kavanaugh Rd., Crestwood, Ky. 40014

[ * ] Notice: The portion of the term of this patent subsequent to Jul. 3, 2013, has been disclaimed.

[21] Appl. No.: 205,068

[22] Filed: Mar. 3, 1994

[51] Int. Cl.⁶ ........................................ G09G 3/04
[52] U.S. Cl. .............................. 345/35; 345/42
[58] Field of Search ...................... 345/35, 36, 37, 345/38, 39, 40, 140, 42; 315/169.3, 169.1

[56] References Cited

U.S. PATENT DOCUMENTS

| | | | |
|---|---|---|---|
| 3,835,465 | 9/1974 | Tannas, Jr. et al. | 345/40 |
| 4,060,801 | 11/1977 | Stein et al. | 345/38 |
| 4,286,265 | 8/1981 | Kauffman et al. | 345/40 |
| 4,429,340 | 1/1984 | Howell | 345/140 |

*Primary Examiner*—Richard Hjerpe
*Assistant Examiner*—Chanh Nguyen

*Attorney, Agent, or Firm*—Middleton & Reutlinger; David W. Carrithers; John F. Salazar

[57] ABSTRACT

Assembly for the display of data, usually an analog signal, generated over a selected time period which includes analog data input, analog to digital conversion to convert the analog data to a digital signal, analog signal input and converter digital signal output, first data latch having an input to receive data from the converter digital signal output, first latch data output, and a first reset input to receive a first switch signal to transfer data from the first latch data input to the first latch data output, first display driver having input to receive the first latch data signal and provide visual indication of the signal at the first latch data output, second data latch having an second latch input to receive data from the first latch data output, and a reset input to receive a second switch signal to transfer data from the second latch data input to the second latch data output, second display driver having input to receive the second latch data signal and provide visual indication of the signal at the second latch data output. A reset signal generator generates the second switch signal and a delay device is provided to receive the second switch signal, delay the signal a selected time and then generate the first latch switch signal.

3 Claims, 1 Drawing Sheet

TIME PERIOD ADJUSTABLE BAR GRAPH DISPLAY

BACKGROUND OF THE INVENTION

The present invention relates in general to data display devices for the visual display of normally encountered conditions such as temperature or pressure which are measured by transducers. The transducers provide a current indication of the condition but do not provide a history of the condition being measured.

In many applications a recording of the history of the condition is important. The prior art has provided numerous devices for recording long term history, for example days, hours or even months. The devices include pen recorders for circular charts for periods from several hours to, usually, a day. Strip chart recorders are provided for recording data over longer term periods. The difference is that the circular chart display all the information while on strip charts the recorded data is rewound onto a takeup roll.

In other cases data is recorded electronically into a device such as a datalogger where it can be retrieved only by electronic devices.

In all such prior art devices the equipment is very expensive and in many cases it is also expensive to maintain.

Additionally because of the nature of the equipment considerable space is required for mounting and servicing the equipment.

No prior art device is known where data can be directly displayed for a period of time which can be easily selected to be adequate for the particular application and easily modified as needed.

SUMMARY OF THE INVENTION

The present invention provides new and useful data recording and display equipment to accomplish objectives unavailable to prior art devices.

Devices within the scope of the present invention are straightforward in design and inexpensive to produce and maintain.

Moreover, devices within the scope of the present invention require very little mounting space.

Briefly, the present invention provides an assembly for the display of data, usually an analog signal, generated over a selected time period which includes analog data input, analog to digital conversion to convert the analog data to a digital signal, analog signal input and converter digital signal output, first data latch having an input to receive data from the converter digital signal output, first latch data output, and a first reset input to receive a first switch signal to transfer data from the first latch data input to the first latch data output, first display driver having input to receive the first latch data signal and provide visual indication of the signal at the first latch data output, second data latch having an second latch input to receive data from the first latch data output, and a reset input to receive a second switch signal to transfer data from the second latch data input to the second latch data output, second display driver having input to receive the second latch data signal and provide visual indication of the signal at the second latch data output. A reset signal generator generates the second switch signal and a delay device is provided to receive the second switch signal, delay the signal a selected time and then generate the first latch switch signal.

One example of an arrangement within the scope of the present invention is shown in the accompanying drawings and described hereinafter but it will be recognized that neither the illustration of the example of a device within the scope of the present invention nor the description thereof are by way of limitation and that other arrangements also within the scope of the present invention will occur to those skilled in the art upon reading the disclosure set forth hereinafter.

BRIEF DESCRIPTION OF THE DRAWINGS

Referring now to the accompanying drawings which illustrate one example of an arrangement within the scope of the present invention.

DETAILED DESCRIPTION OF THE DRAWINGS

Figure 1:
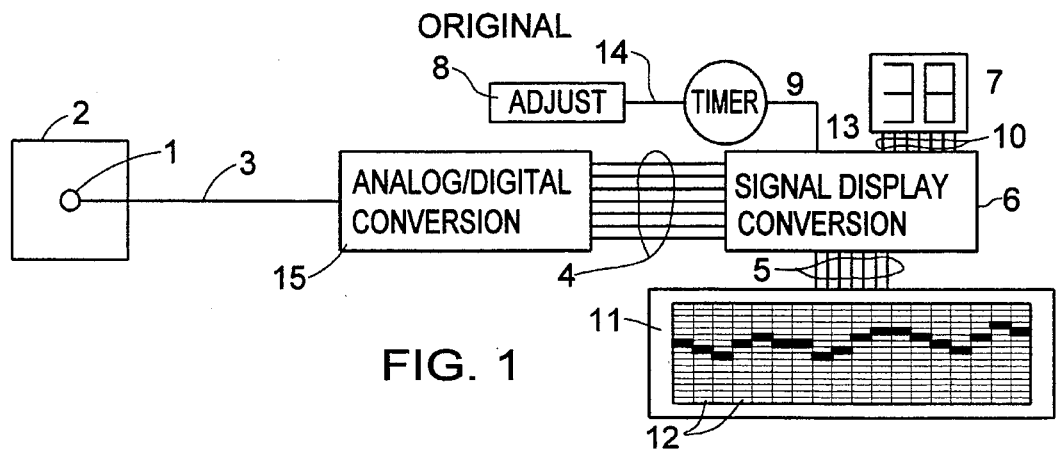
FIG. 1 is a flow schematic of one example of an arrangement within the scope of the present invention.

Referring to the drawings which describe one example of an arrangement within the scope of the present invention a transducer, for example a temperature probe 1 is shown measuring the temperature in an enclosure 2. While the arrangement shown illustrates temperature measurement it will be understood that devices within the scope of the present invention can be used for a wide variety of applications utilizing different transducers.

The signal 3 from the transducer 3 is supplied to an analog/digital conversion device 15 as known in the art to generate a multibit digital signal 4 indicative of the temperature signal.

Figure 2:
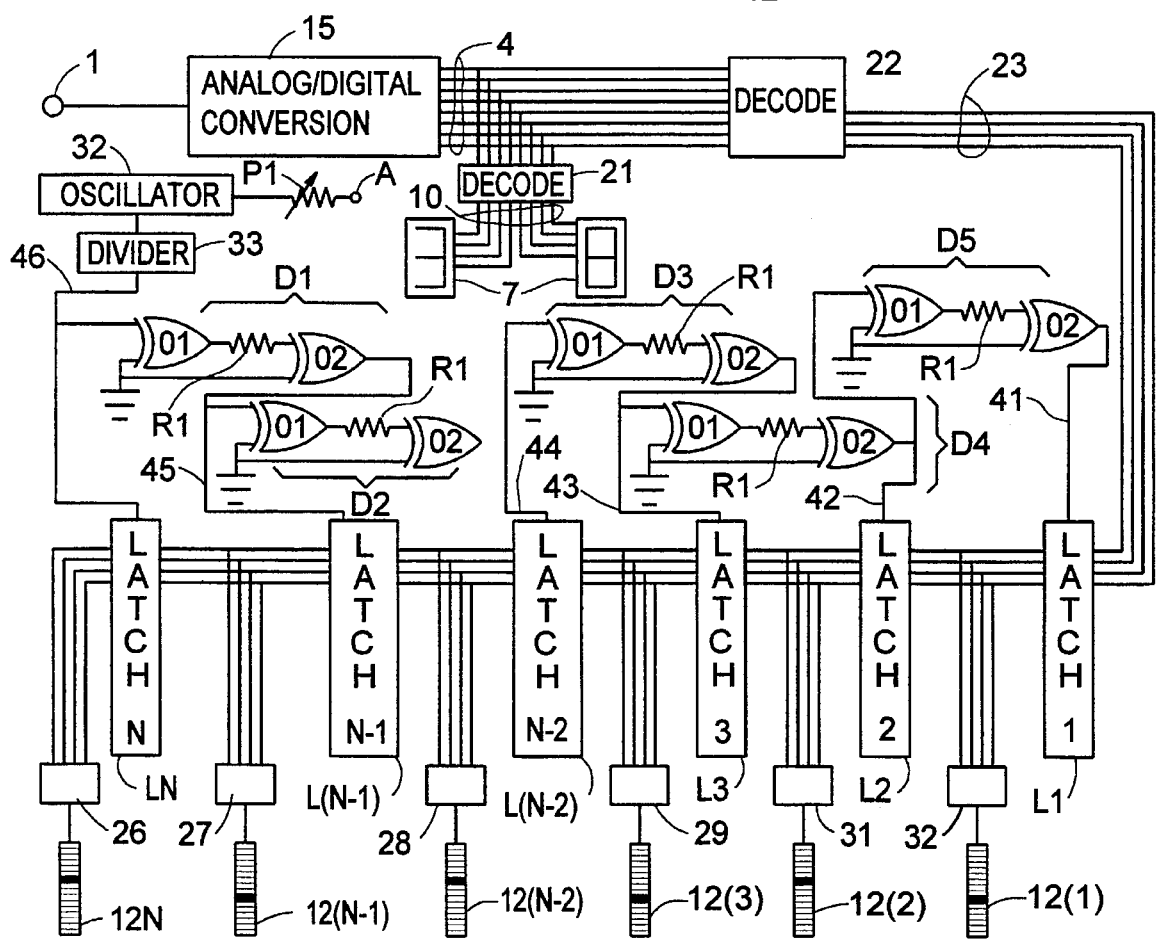
FIG. 2 is a more detailed schematic of one example of an arrangement within the scope of the present invention.

The digital signal 4 is supplied to a SIGNAL DISPLAY CONVERSION module an example of one of which is illustrated in FIG. 2 and described hereinafter. The signal conversion display module generates a signal 10 to a readout 7 of the type known in the art which displays the current value of the condition being monitored, in this case temperature.

A timer 9 is provided to generate a timed pulse 13 at a frequency determined by an adjustment means 8 which sets the frequency by means of a signal 14 as described with reference to FIG. 2 hereinafter. The timed pulses are used to sequentially measure the conditioned to be monitored and generate signals 5 which are used to visual display 11 including segmented readouts 12 which individually reflect the condition being monitored at different times. The condition, once read is progressed through the segments as described hereinafter to provide a time history of the level of the condition.

Referring to FIG. 2 a more detailed description of an arrangement within the scope of the present invention is illustrated where the signal from transducer 1 is supplied to the analog/digital converter 15 to generate parallel digital signals 4.

Signals 4 are decoded in a decode device 21, for example a Read Only Memory device to convert the signal into useable format such as temperature corresponding to the signal level from analog/digital converter 15 where the temperature is displayed on readout 7 on a continuous basis.

The signals 4 from the analog/digital converter are also supplied to a second decode device 22, which can also be of the Read Only Memory type to convert the signals to a format suitable for timed display. While different arrangements within the scope of the present invention will occur to those skilled in the art, in the example shown the decode device 22 converts the signals 4 to four bit parallel format 23. The signals 23 are then supplied to a Latch L1.

The signal 23 supplied to latch L1 is the current signal. As is known in the art the signal is not transmitted to the outputs of the latch until the latch goes "transparent" upon receipt of a signal 41 at the latch input. At this time the signal is transmitted to the outputs of the latch and to another decode device 32, in this case a 4 to 16 bit converter. The device receives the four bit input from the output of the latch L1 and depending on the configuration of the signal turns on one of 16 outputs which then turns on one of the 16 segments of the display segment 12-1. The segments 12(1) as shown in FIG. 2 then indicate the status of the condition being monitored.

As shown any number of latch and display segments can be provided depending on the particular requirements of the application. In FIG. 2 six segments with latches L1, L2, L3 L(N-2), L(N-1) and LN are illustrated but there can be any desired number of segments. Also, each display is a 16 segment display but it will be understood that within the scope of the present invention higher resolution arrangements can be provided.

As previously discussed, the condition status is sampled periodically and the status displays are progressively sequenced across the display 12 [1] through 12N and finally deleted. A timing circuit many of which are known in the art is used to sample an sequence the signals.

In the arrangement shown in FIG. 2 delay circuits each including two exclusive "OR" gates O1 and O2 are connected through a resistor R1 to generate delays in a timing signal 46 generated from a clock including and oscillator 50 which generates regular pulses at a frequency determined by potentiometer P1. Since the oscillator operates at a high rate of speed the output pulses from the oscillator are supplied to a divider 33 which generates pulses 46 in acceptable ranges. The signal 46 is supplied to Latch LN and transfers the signal from the input of the latch to the output and to converter 26 so the signal is displayed as a level on display 12N.

Signal 46 is also supplied to the first time delay circuit previously described and generates signal 45 which is delayed a selected time depending on the characteristics of the "OR" gates O1 and O2. The first delayed signal 45 supplied to latch L(N-1) so the signal at the output of latch L(N-2) is transmitted through latch L(N-1) and the signal level previously displayed on display 12(N-2) is now displayed on display 12(N-1) associated with latch 12(N-1). The signal 45 is also supplied to the second delay D2 to generate twice delayed signal 44 which is supplied to latch L(N-2) to transfer the signal at the output of latch L3 to the output of latch L(N-2) and to delay circuit D3 to generate delay signal 43.

In this manner the current signal 23 level is finally introduced to latch L1 by signal 41 and the signal level of the preceeding samples are displayed on display segments 12(1)–12(N) which have been sequenced through the display panel 12. The total time required for transfer from segment 12(1) to 12(N) is determined by the rate of pulse of the clock, in this case by the setting of potentiometer P1.

The total time of display is thus adjustable and can be adjusted as needed.

It will be understood that the foregoing are but a few examples of arrangemetns within the scope of the present invention and that other arrangements also within the scope of the present invention will occur to those skilled in the art upon reading the disclosure set forth hereinbefore

The invention claimed is:

1. A historical condition display and delayed latching device, comprising:

transducer input means for producing an analog input signal;

an analog to digital converter for receiving said analog input signal and generating a plurality of parallel digital input signals;

a first decoder for receiving said parallel digital input signals and driving at least one digital display;

a second decoder for receiving said parallel digital input signals and generating a four bit parallel digital input signal;

an adjustable timing signal delayed through a delay circuit and producing a plurality of selectively delayed active signals;

a plurality of latches connected in series, each of said plurality of latches receiving as input said four bit parallel digital input signal and one of said selectively delayed active signal and generating as output a selectively latched four bit digital signal, said plurality of latches arranged such that said parallel digital input signal cascades through each successive latch connected in series, said parallel digital input signal being transferred from one latch to another based upon said plurality of selectively delayed active signals;

a plurality of decoders, each of said decoders receiving said selectively latched four bit digital signals output from one of said plurality of latches and driving a digital 16 segment display bar graph.

2. The display and latching device of claim 1 wherein said adjustable timing signal further comprises a potentiometer adjustably connected to an oscillator, said oscillator producing a regular pulsed timing signal to a divider, said divider generating signals for said delay circuit.

3. The display and latching device of claim 1 wherein said delay circuit further comprises a plurality of paired exclusive OR gates, each of said plurality of paired exclusive OR gates generating an active signal for one of said plurality of latches such that said selectively latched four bit digital signal cascades from the a first latch to a last latch based upon said selectively delayed active signals.

* * * * *